(12) United States Patent
Hung et al.

(10) Patent No.: US 7,256,480 B2
(45) Date of Patent: Aug. 14, 2007

(54) LEAD FRAME PACKAGE STRUCTURE WITH HIGH DENSITY OF LEAD PINS ARRANGEMENT

(75) Inventors: Chih-Pin Hung, Kao-Hsiung (TW); In-De Ou, Kao-Hsiung (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 0 days.

(21) Appl. No.: 11/164,823

(22) Filed: Dec. 7, 2005

(65) Prior Publication Data

US 2007/0080431 A1  Apr. 12, 2007

(30) Foreign Application Priority Data

Oct. 12, 2005  (TW)  .............................. 94135493 A

(51) Int. Cl.
*H01L 23/495* (2006.01)
*H01L 23/48* (2006.01)

(52) U.S. Cl. ...................... 257/666; 257/672; 257/676; 257/692

(58) Field of Classification Search ................ 257/666, 257/672, 676, 692, 784
See application file for complete search history.

(56) References Cited

U.S. PATENT DOCUMENTS 6,777,785 B1 *  8/2004  Shyu  .......................... 257/666

\* cited by examiner

*Primary Examiner*—Hsien-Ming Lee
(74) *Attorney, Agent, or Firm*—Winston Hsu

(57) ABSTRACT

A lead frame package structure with high density of lead pins arrangement is formed. The lead frame structure includes a die, a plurality of first lead pins and a plurality of second lead pins, wherein the first lead pins and the second lead pins are positioned on at least one side of the die, and are electrically connected to the die. The first lead pins and the second lead pins are selected from a group consisting of J-leads, L-leads and I-leads, and terminals of the first lead pins and terminals of the second lead pins are staggered so that the high density of lead pins arrangement is formed without risking a short circuit.

7 Claims, 17 Drawing Sheets

LEAD FRAME PACKAGE STRUCTURE WITH HIGH DENSITY OF LEAD PINS ARRANGEMENT

BACKGROUND OF THE INVENTION

1. Field of the Invention

The present invention relates to a lead frame package structure. More particularly, the present invention relates to a lead frame package structure with high density of lead pins arrangement.

2. Description of the Prior Art

The lead frame package structure has been widely used in integrated circuit packages for a long time, resulting in its advantages of having a low cost and a high reliability. The lead frame package structure has accordingly gained a share of the market of low pin count packages.

Please refer to FIG. 1, FIG. 2, and FIG. 3. FIG. 1 is a schematic top view of a prior art lead frame package structure 10, FIG. 2 is a schematic side view of the prior art lead frame package structure 10 in FIG. 1, and FIG. 3 is a schematic top view of a prior art printed circuit board 30. As shown in FIG. 1 and FIG. 2, the prior art lead frame package structure 10 comprises a die 12, a plurality of lead pins 14, and a die positioned area 16. Each lead pin 14 comprises an inner terminal 22 and an outer terminal 24, and the die 12 comprises a plurality of bonding pads 18 electrically connected to the corresponding inner terminals 22 of the lead pins 14. In addition, there is a sealing glue 26 solidified for sealing the die 12 and the inner terminals 22 within the package structure. The sealing glue 26 is presumed to be transparent so that the inner structure of this prior art lead frame package structure 10 could be seen. As shown in FIG. 3, each inner terminal 22 of the lead pin 14 is electrically connected to a corresponding bonding pad 32 of the prior art printed circuit board 30. More particularly, the inner terminals 22 are arranged along a straight line in the prior art lead frame package structure 10. Similarly, the outer terminals 24 and the bonding pads 32 are arranged along a straight line, wherein there is a distance 24a between every two outer terminals 24 and a distance 32a between every two bonding pads 32.

However, in order to match up to the higher density integrated circuit product, the size of package structure should decrease without decreasing the quantity of lead pins, or the quantity of lead pins should increase without increasing the size of package structure. In other words, lead frame package structures with higher densities of lead pins arrangements should be developed. The lead pins arrangement of the prior art lead frame package structure 10 is limited in its ability to increase the density of lead pins. In the prior art, as the density of lead pins 14 increases, the distance 24a between every two lead pins 14 decreases, so that the probability of cross-talk, the probability of interference, and the difficulty of manufacturing the package structure increases. Theoretically, one lead pin 14 should only be electrically connected to one corresponding bonding pad 32. However, factors such as thermal expansion, flow of the solder, and misalignment may cause the lead pins 14 to couple with each other. As a result, the short lead pins 14 reduce the performance of products.

In the prior art lead frame package structure 10, the density of lead pins 14 should increase in order to decrease the size of lead frame package structure 10 or to increase the quantity of lead pins 14. Thus, the distance 24a between each terminal 22,24 decreases as the density of lead pins 14 increases. As a result, the probability of cross-talk, the probability of interference, and the difficulty of manufacturing the package structure increases. Briefly, the prior art lead pins arrangement is a poses a restriction on the development of higher density integrated circuit products.

SUMMARY OF THE INVENTION

Therefore a primary object of the claimed invention to provide a lead frame package structure with high density of lead pins arrangement to overcome the aforementioned problems.

According to the claimed invention, a lead frame package structure comprises a die; a plurality of first type lead pins positioned on at least one side of the die and electrically connected to the die; and a plurality of second type lead pins positioned on at least one side of the die and electrically connected to the die, wherein the first type lead pins and the second type lead pins are two different types of lead pins selected from the group consisting of J-leads, L-leads and I-leads.

Because the first type lead pins and the second type lead pins are two different types of lead pins selected from the group consisting of J-leads, L-leads and I-leads, the first type lead pins and the second type lead pins are not arranged straight in a single line, but the first type lead pins and the second type lead pins are staggered. Because of the arrangement, the distance between the terminals increases without changing the distance between the lead pins, or the distance between the lead pins decreases without changing the distance between the terminals. Resulting from the higher density of lead pins, the size of lead frame package structure decreases, or the quantity of lead pins increases, for increasing the density of integrated circuit products.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
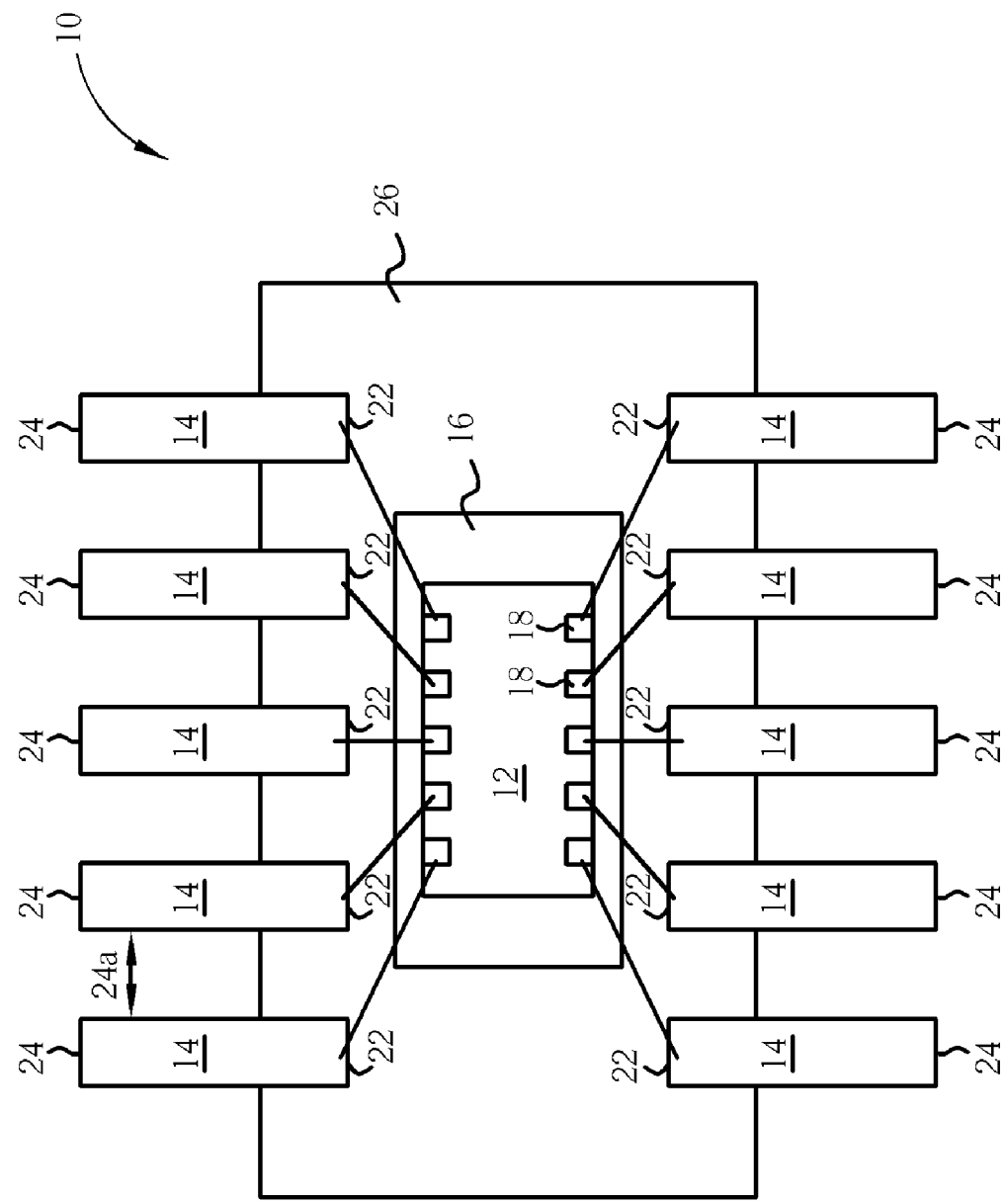
FIG. 1 is a schematic top view of a prior art lead frame package structure.
Figure 2:
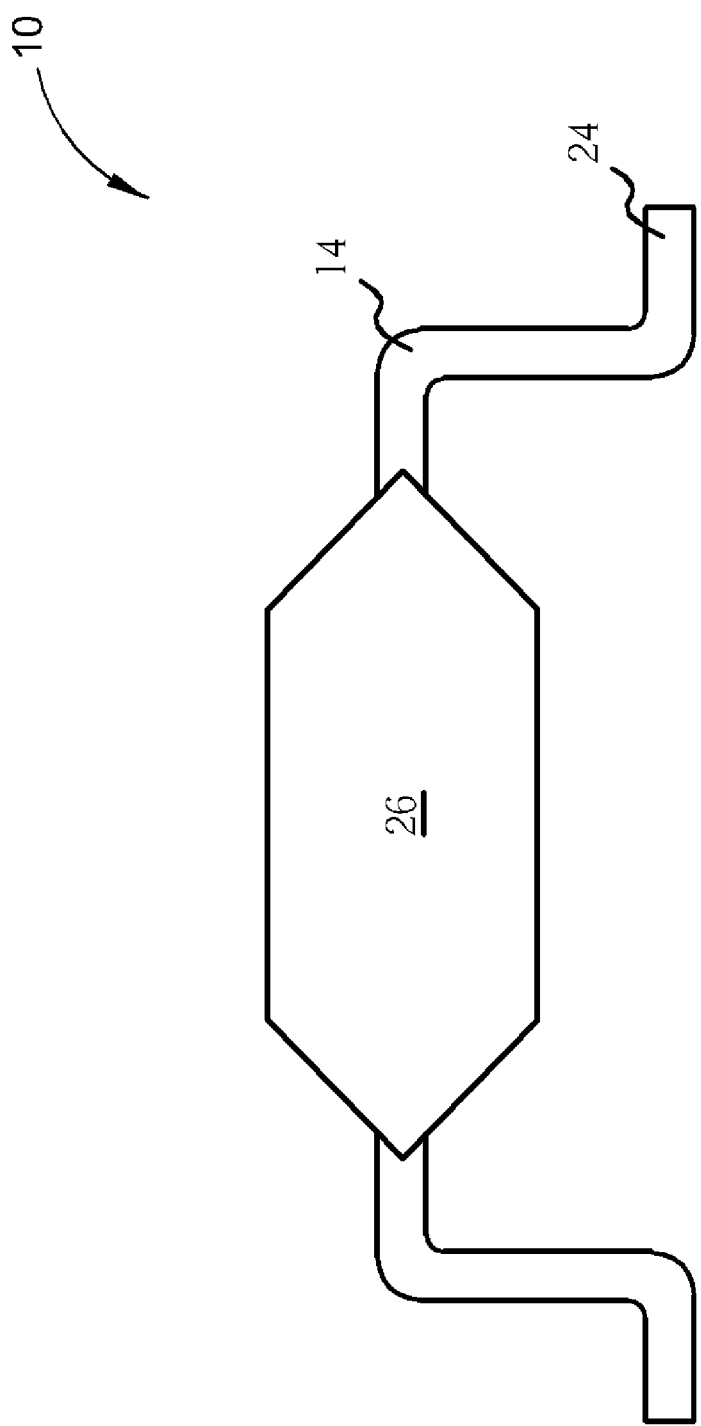
FIG. 2 is a schematic side view of the prior art lead frame package structure in FIG. 1.
Figure 3:
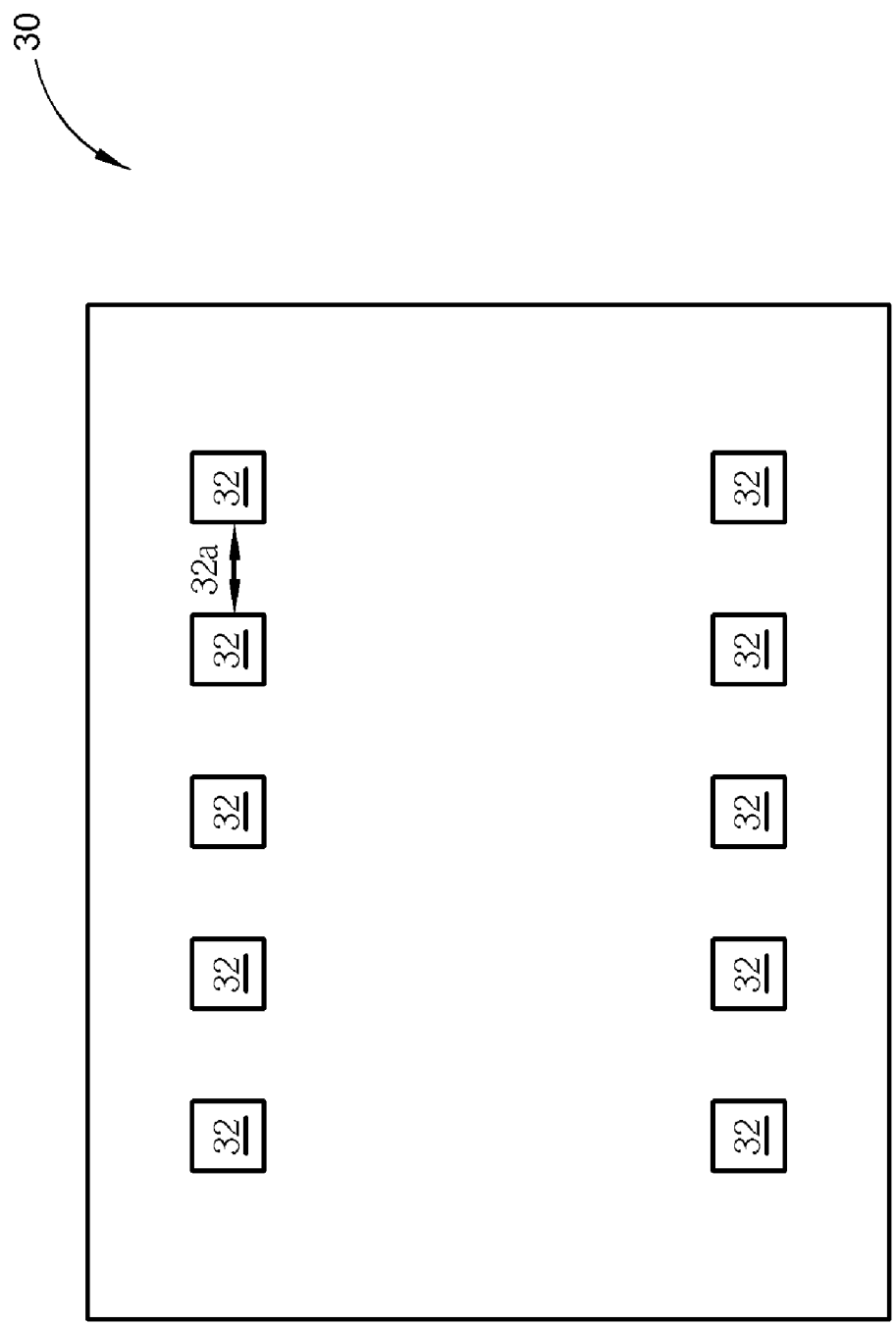
FIG. 3 is a schematic top view of a prior art printed circuit board.
Figure 4:
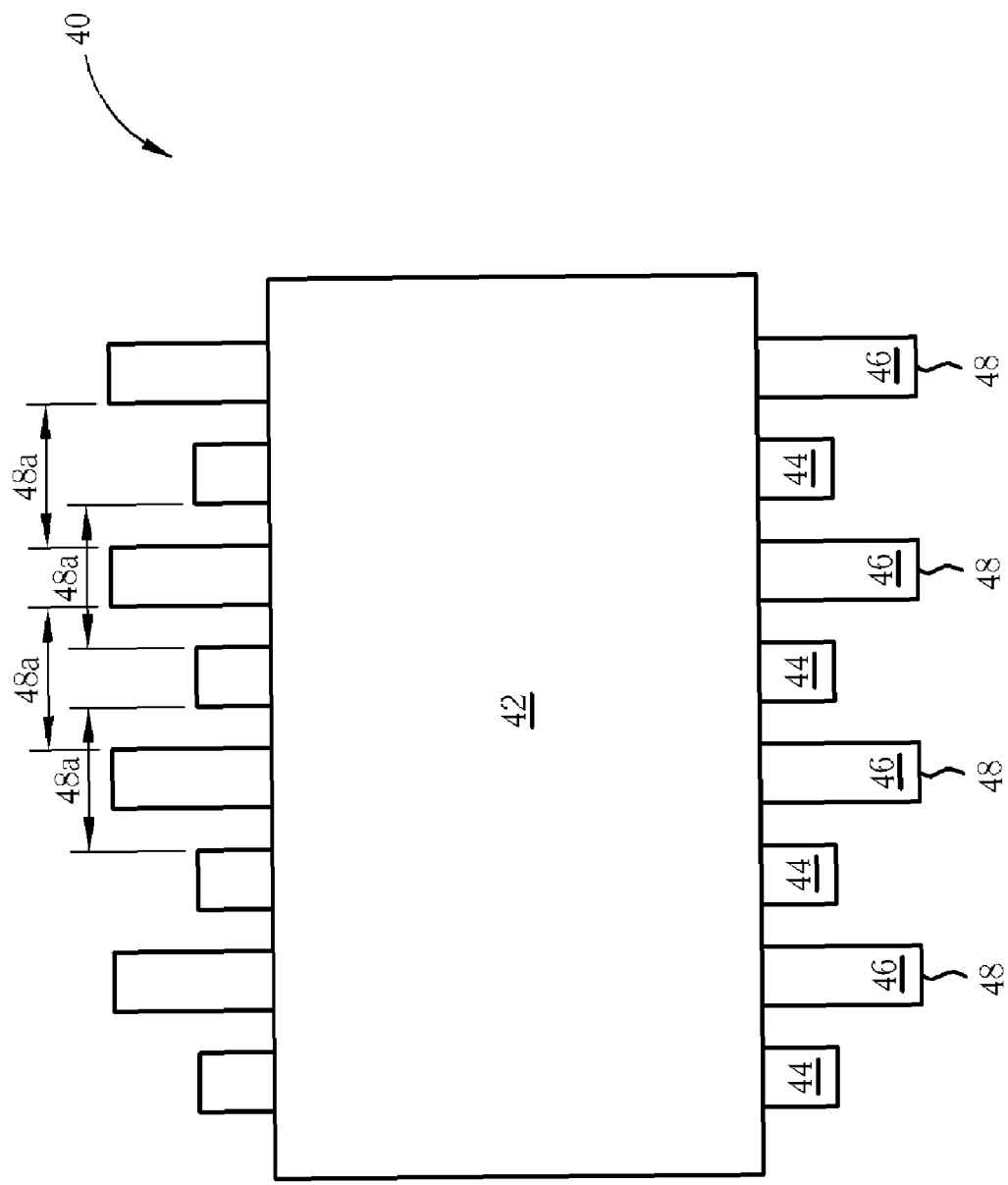
FIG. 4 is a schematic top view of a lead frame package structure according to the first preferred embodiment of the present invention.
Figure 5:
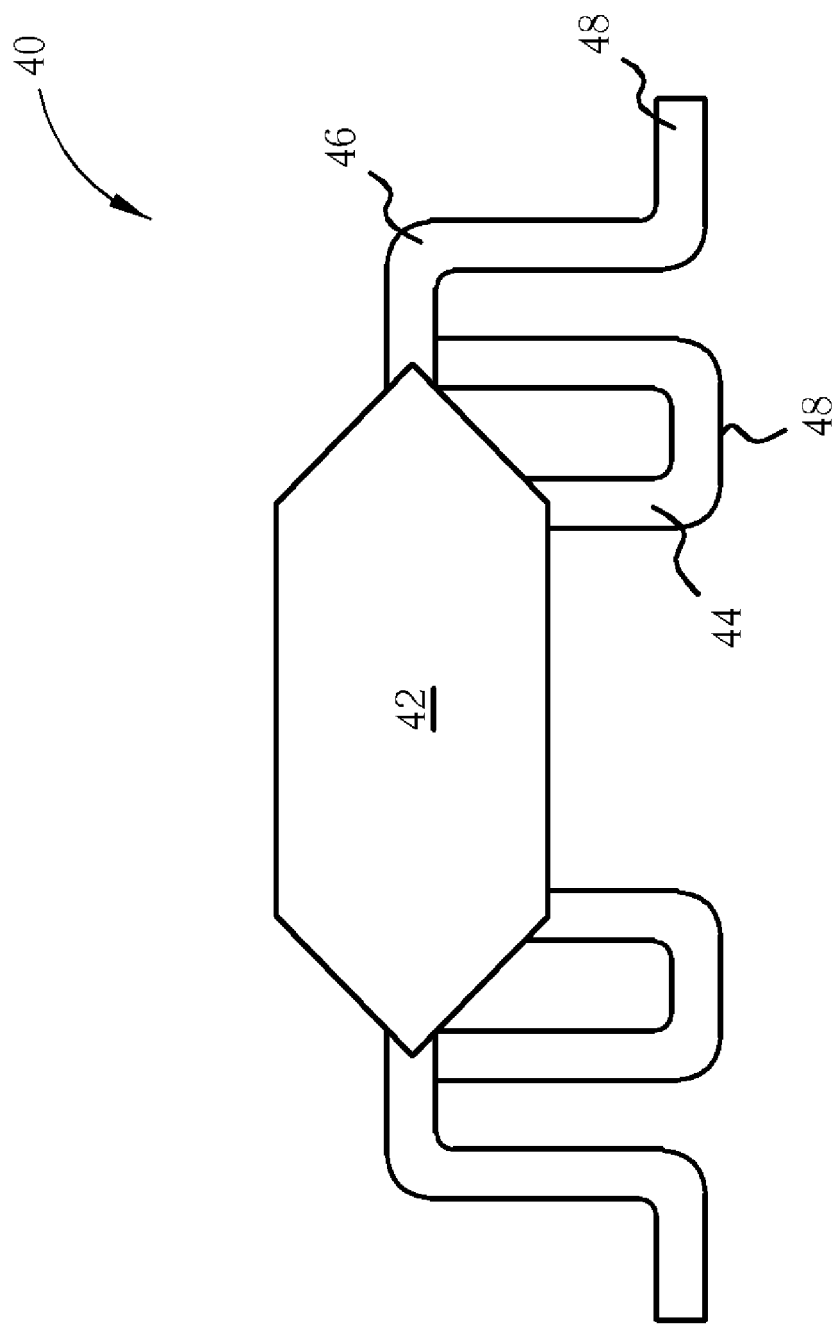
FIG. 5 is a schematic side view of the lead frame package structure in FIG. 4.
Figure 6:
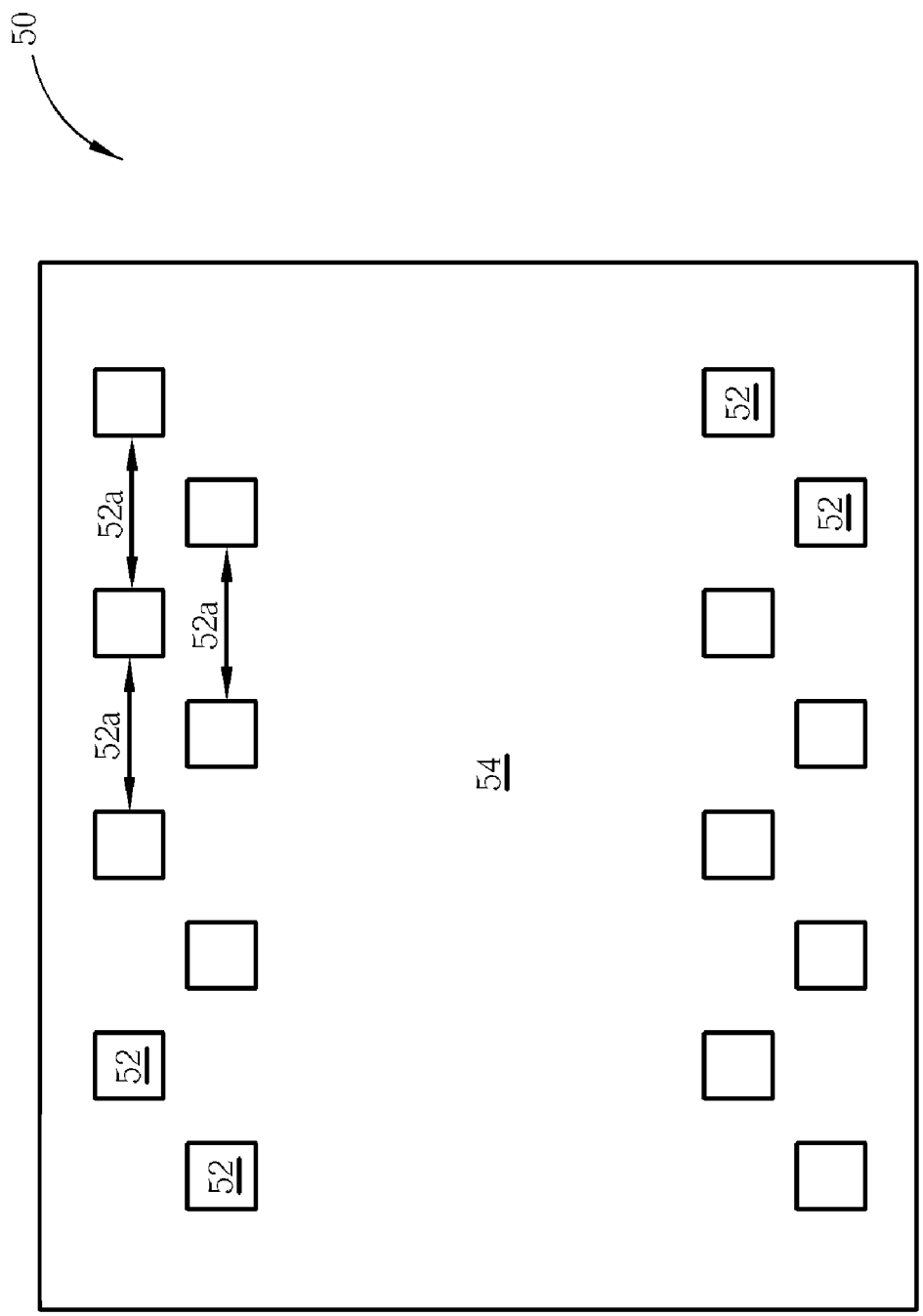
FIG. 6 is a schematic top view of a printed circuit board according to the first preferred embodiment of the present invention.

Please refer to FIG. 4, FIG. 5, and FIG. 6. FIG. 4 is a schematic top view of a lead frame package structure 40 according to the first preferred embodiment of the present invention, FIG. 5 is a schematic side view of the lead frame package structure 40 in FIG. 4, and FIG. 6 is a schematic top view of a printed circuit board 50 according to the first preferred embodiment of the present invention. As shown in FIG. 4 and FIG. 5, the lead frame package structure 40 comprises a die package 42, a plurality of J-leads 44, and a plurality of L-leads 46. Either each J-lead 44 or each L-lead 46 comprises an inner terminal (not shown in the figure) and an outer terminal 48, wherein there is a distance 48a between every two outer terminals 48 that are arranged in a single line. As shown in FIG. 6, the printed circuit board 50 is provided. The printed circuit board 50 comprises a plurality of bonding pads 52 corresponding to the outer terminal 48, and there is a distance 52a between every two bonding pads 52 that are arranged in a single line. Furthermore, a solder resist 54 is formed on the surface of the printed circuit board 50 except for the bonding pads 52 so as to reduce the probability of cross-talk. Thus, the bonding pads 52 are exposed by a plurality of solder resist openings. Either the outer terminals 48 of the J-leads 44 or the outer terminals 48 of the L-leads 46 are electrically connected to the corresponding bonding pads 52 of the printed circuit board 50. The characteristic of this preferred embodiment is that both the outer terminals 48 and the bonding pads 52 are staggered and arranged in two lines, and the inner terminals are arranged straight in a single line. Besides, the inner terminals are not limited to be arranged straight in a single line, but the inner terminals can instead be staggered.

With the same distance between every two lead pins, the distance 48a of the staggered lead pin arrangement is longer than the distance 24a of the straight lead pin arrangement. Specifically speaking, the distance 48a of the staggered lead pin arrangement is twice as long as the distance 24a of the straight lead pin arrangement, and the distance 52a of the staggered bonding pad arrangement is twice as long as the distance 32a of the straight bonding pad arrangement. That means, with the same distance between every two lead pins, the present invention comprises more lead pins for connecting.

Figure 7:
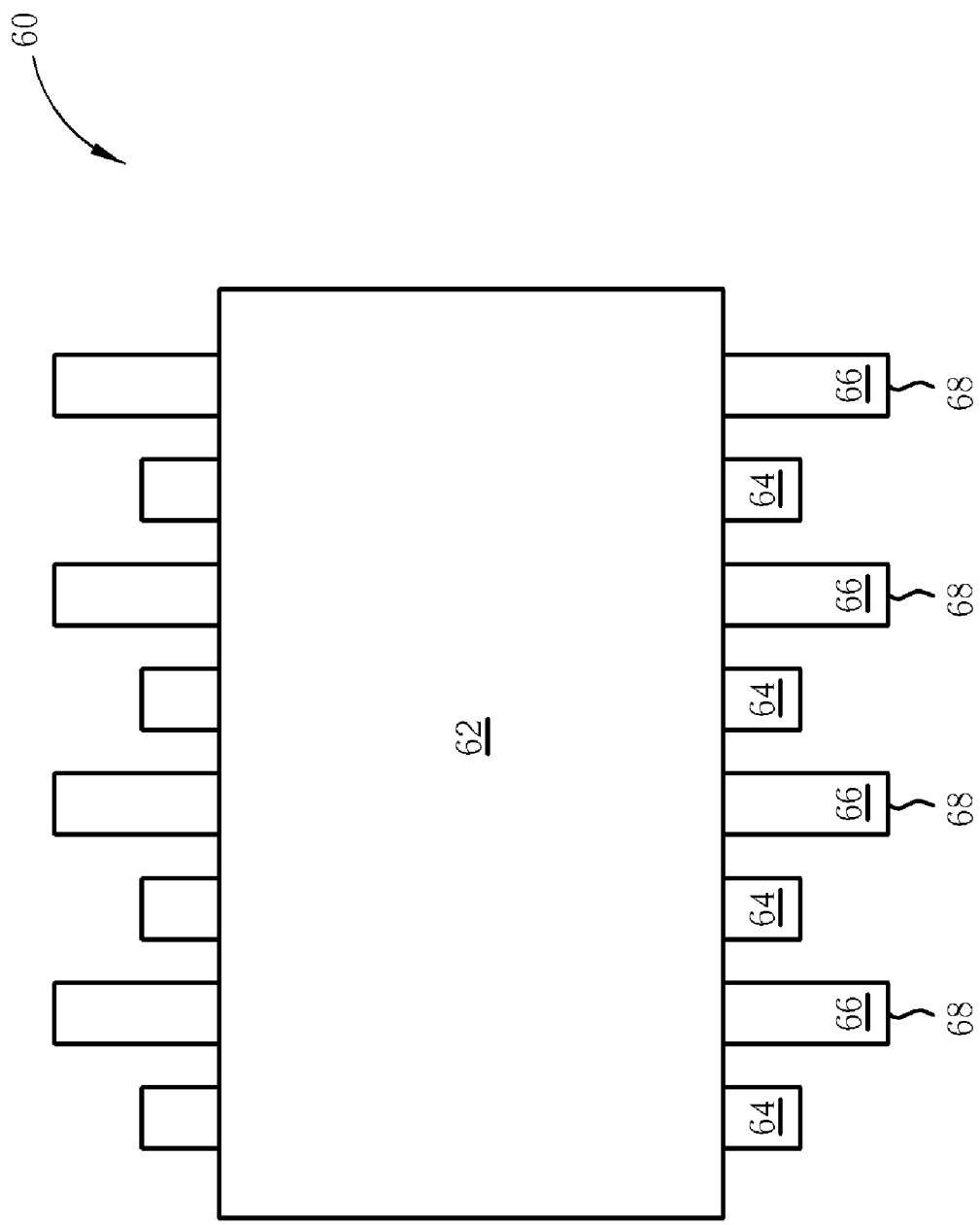
FIG. 7 is a schematic top view of a lead frame package structure according to the second preferred embodiment of the present invention.
Figure 8:
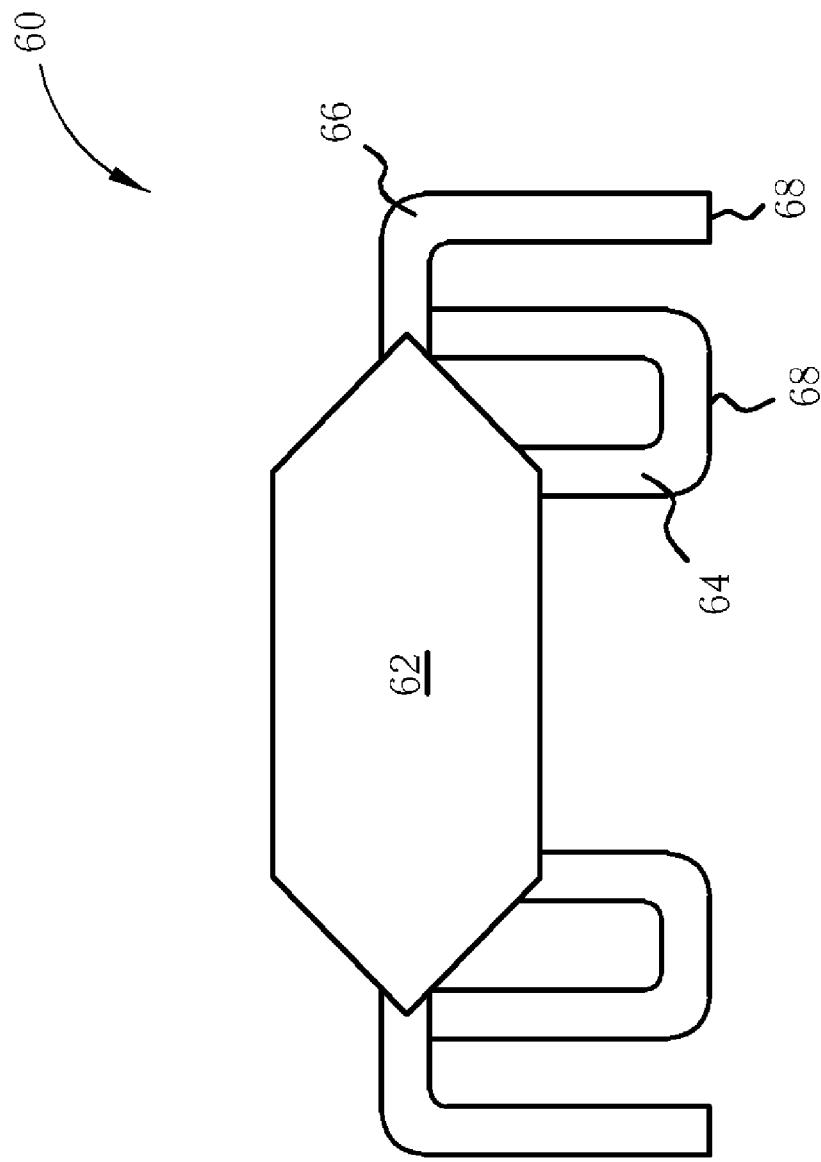
FIG. 8 is a schematic side view of the lead frame package structure in FIG. 7.
Figure 9:
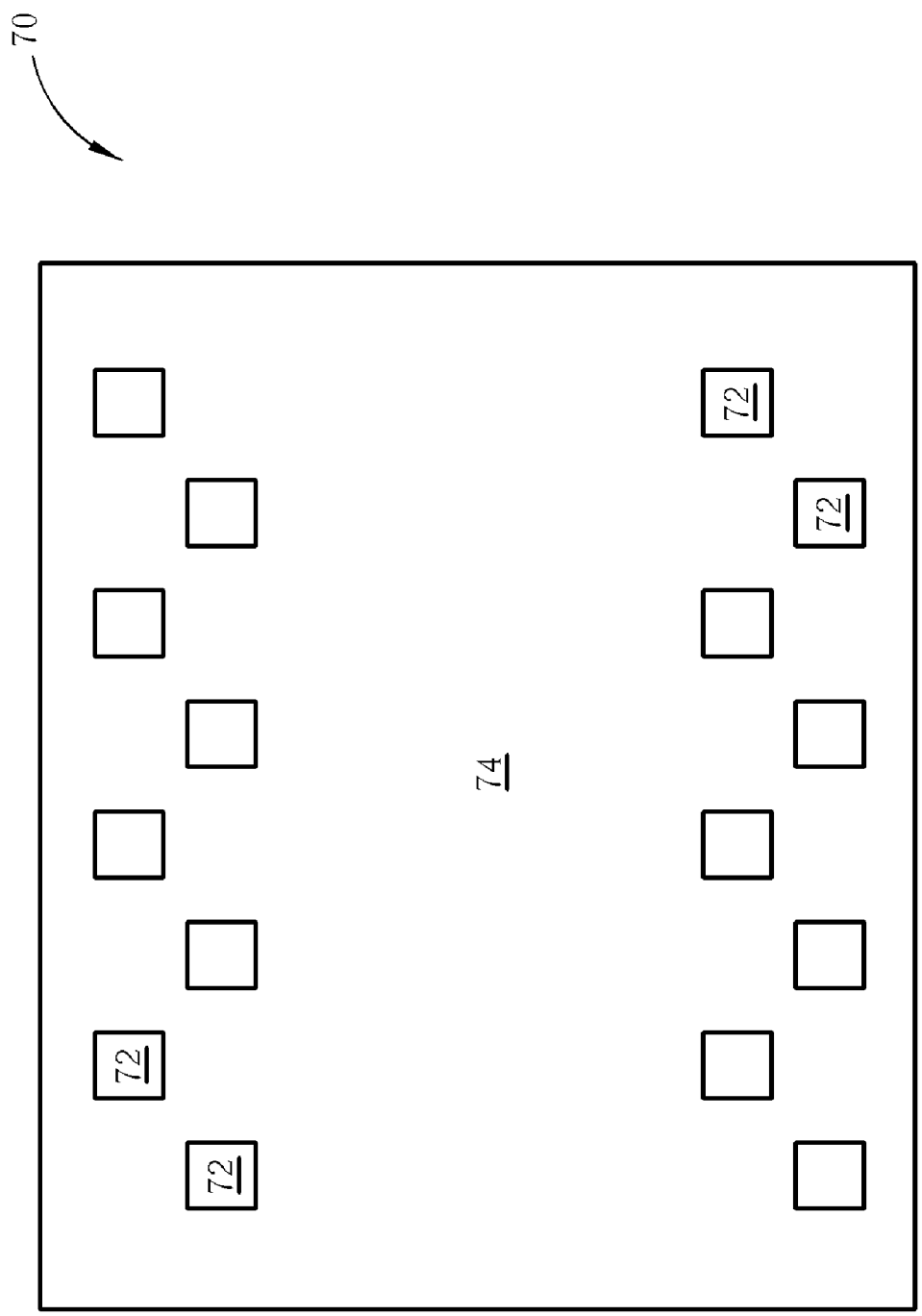
FIG. 9 is a schematic top view of a printed circuit board according to the second preferred embodiment of the present invention.

Please refer to FIG. 7, FIG. 8, and FIG. 9. FIG. 7 is a schematic top view of a lead frame package structure 60 according to the second preferred embodiment of the present invention, FIG. 8 is a schematic side view of the lead frame package structure 60 in FIG. 7, and FIG. 9 is a schematic top view of a printed circuit board 70 according to the second preferred embodiment of the present invention. As shown in FIG. 7 and FIG. 8, different from the first preferred embodiment, the lead frame package structure 60 comprises a die package 62, a plurality of J-leads 64, and a plurality of I-leads 66. Either each J-lead 64 or each I-lead 66 comprises an inner terminal (not shown in the figure) and an outer terminal 68. As shown in FIG. 9, the printed circuit board 70 is provided. The printed circuit board 70 comprises a plurality of bonding pads 72 corresponding to the outer terminals 68. Furthermore, a solder resist 74 is formed on the surface of the printed circuit board 70 except for the bonding pads 72. The outer terminals 68 of the J-leads 64 and the outer terminals 68 of the I-leads 66 are electrically connected to the corresponding bonding pads 72 of the printed circuit board 70.

Figure 10:
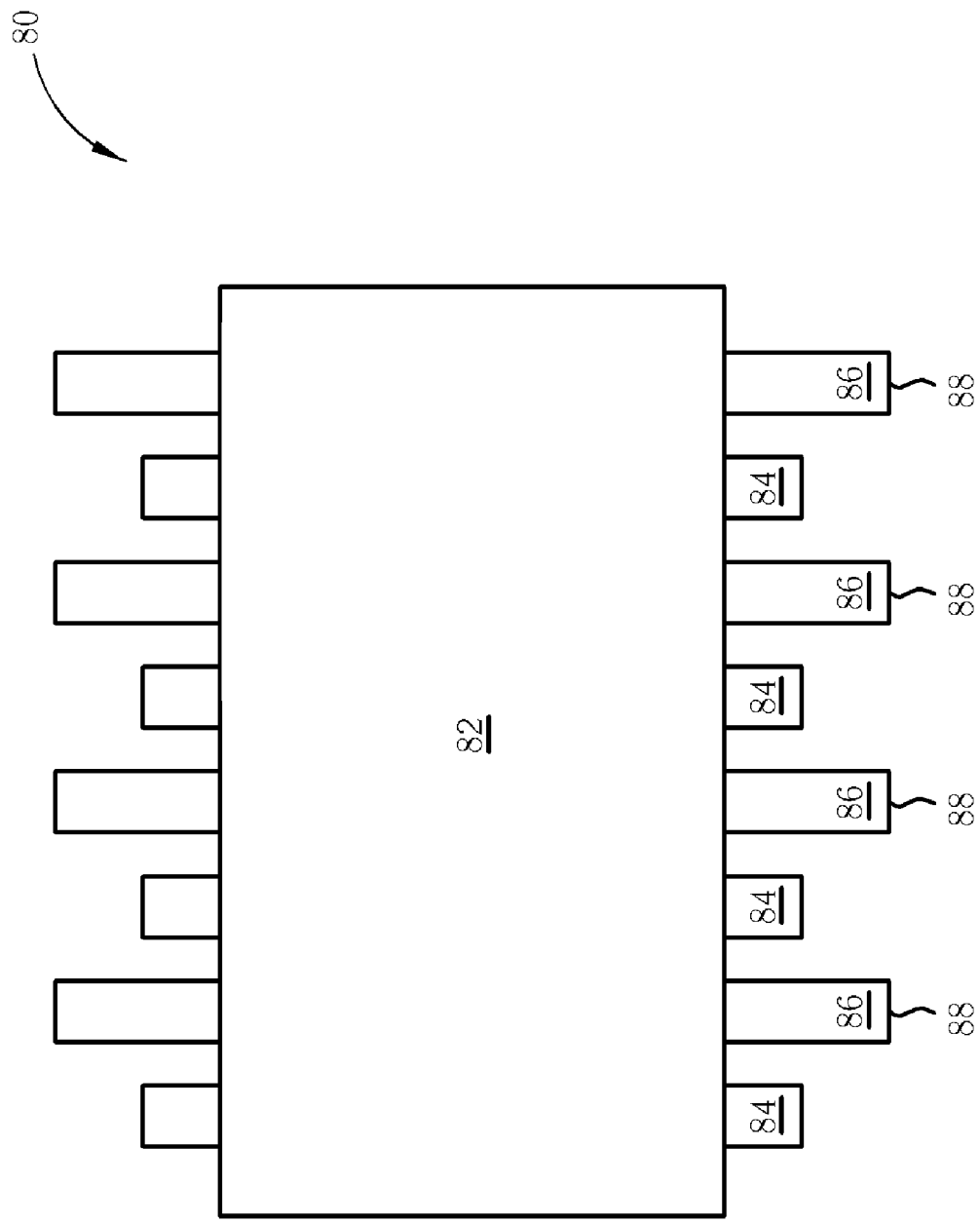
FIG. 10 is a schematic top view of a lead frame package structure according to the third preferred embodiment of the present invention.
Figure 11:
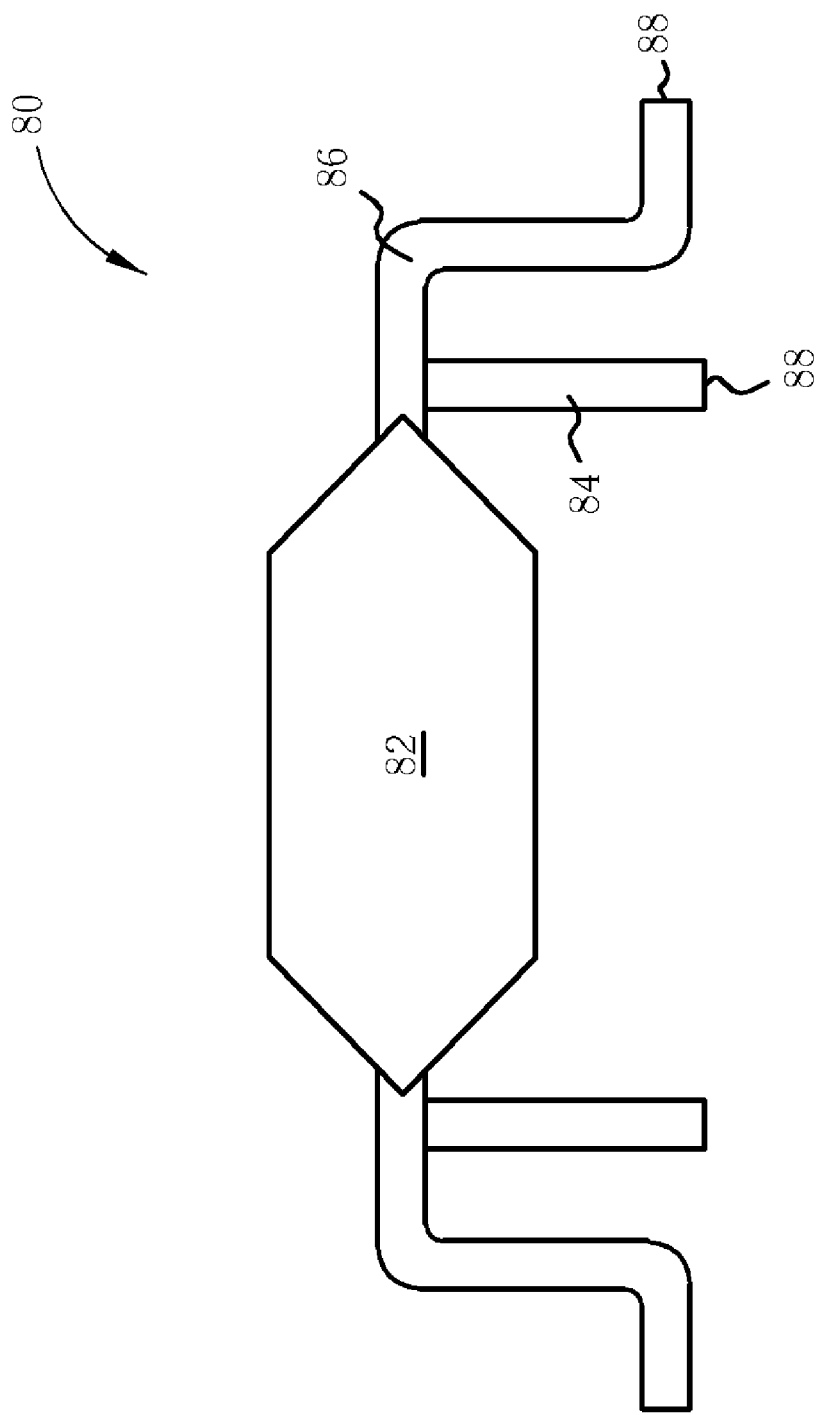
FIG. 11 is a schematic side view of the lead frame package structure in FIG. 10.
Figure 12:
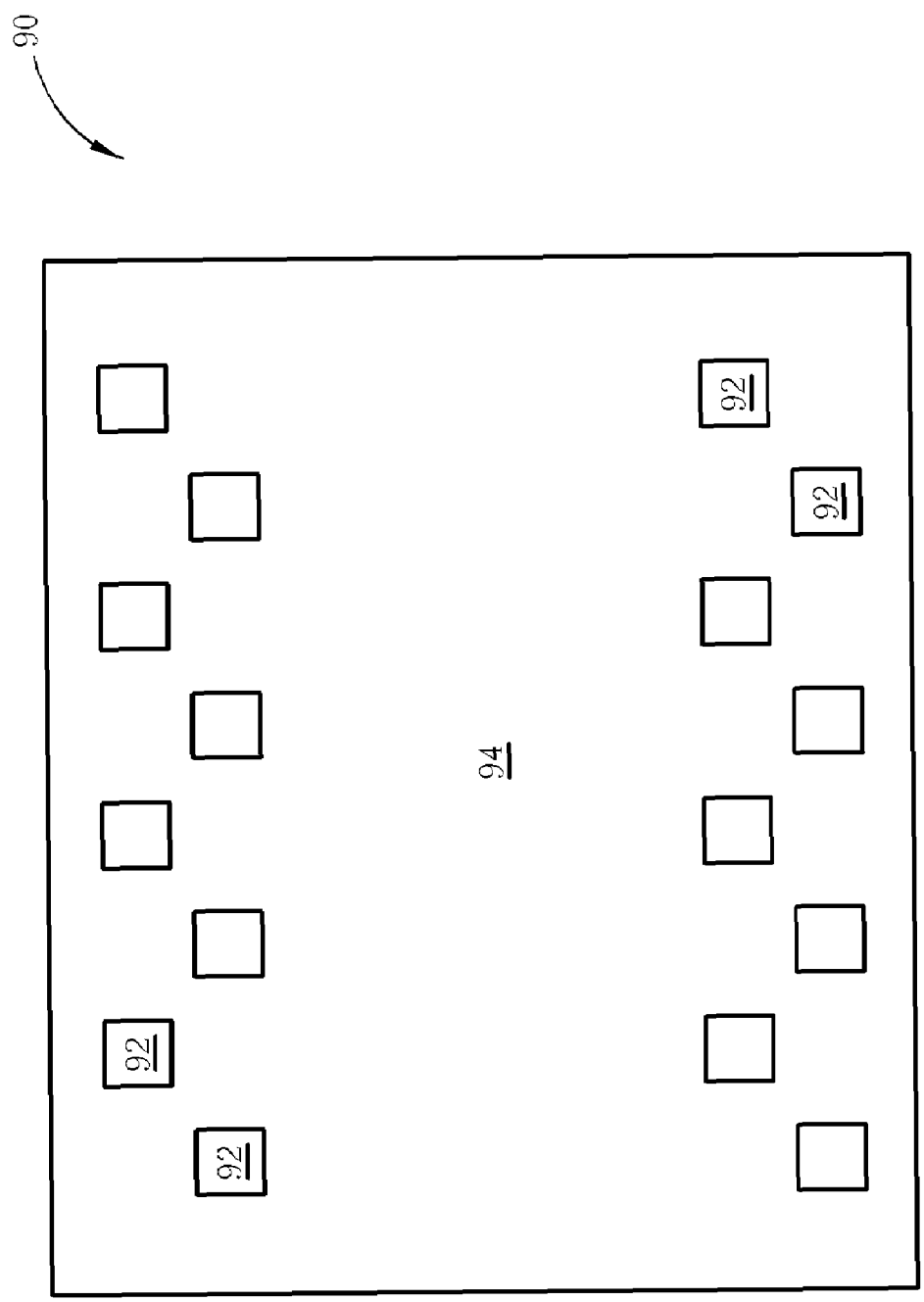
FIG. 12 is a schematic top view of a printed circuit board according to the third preferred embodiment of the present invention.

Please refer to FIG. 10, FIG. 11, and FIG. 12. FIG. 10 is a schematic top view of a lead frame package structure 80 according to the third preferred embodiment of the present invention, FIG. 11 is a schematic side view of the lead frame package structure 80 in FIG. 10, and FIG. 12 is a schematic top view of a printed circuit board 90 according to the third preferred embodiment of the present invention. As shown in FIG. 10 and FIG. 11, different from the first and the second preferred embodiments, the lead frame package structure 80 comprises a die package 82, a plurality of I-leads 84, and a plurality of L-leads 86. Either each I-lead 84 or each L-lead 86 comprises an inner terminal (not shown in the figure) and an outer terminal 88. As shown in FIG. 12, the printed circuit board 90 is provided. The printed circuit board 90 comprises a plurality of bonding pads 92 corresponding to the outer terminals 88. Furthermore, a solder resist 94 is formed on the surface of the printed circuit board 90 except for the bonding pads 92. The outer terminals 88 of the I-leads 84 and the outer terminals 88 of the L-leads 86 are electrically connected to the corresponding bonding pads 92 of the printed circuit board 90.

Figure 13:
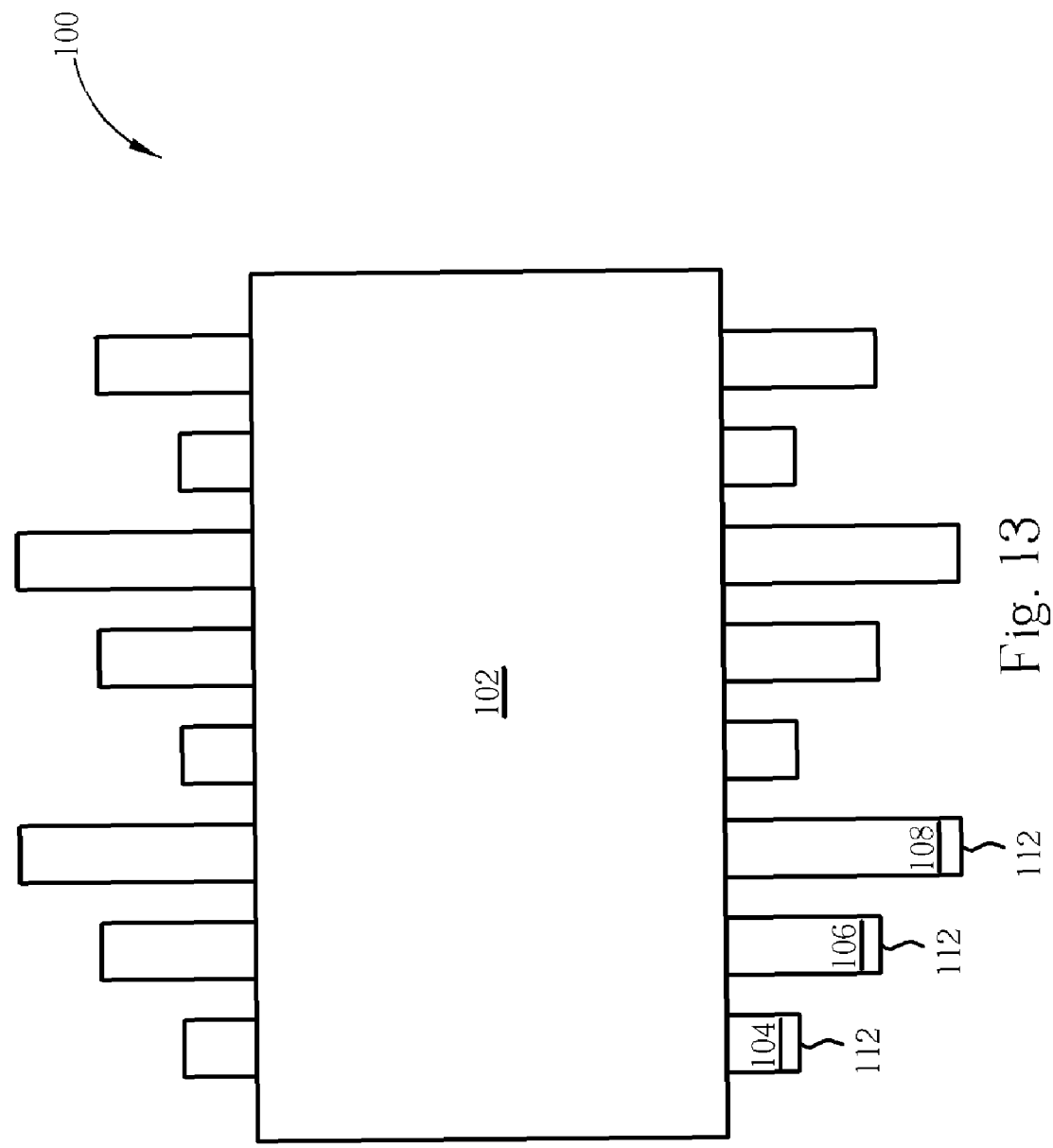
FIG. 13 is a schematic top view of a lead frame package structure according to the fourth preferred embodiment of the present invention.
Figure 14:
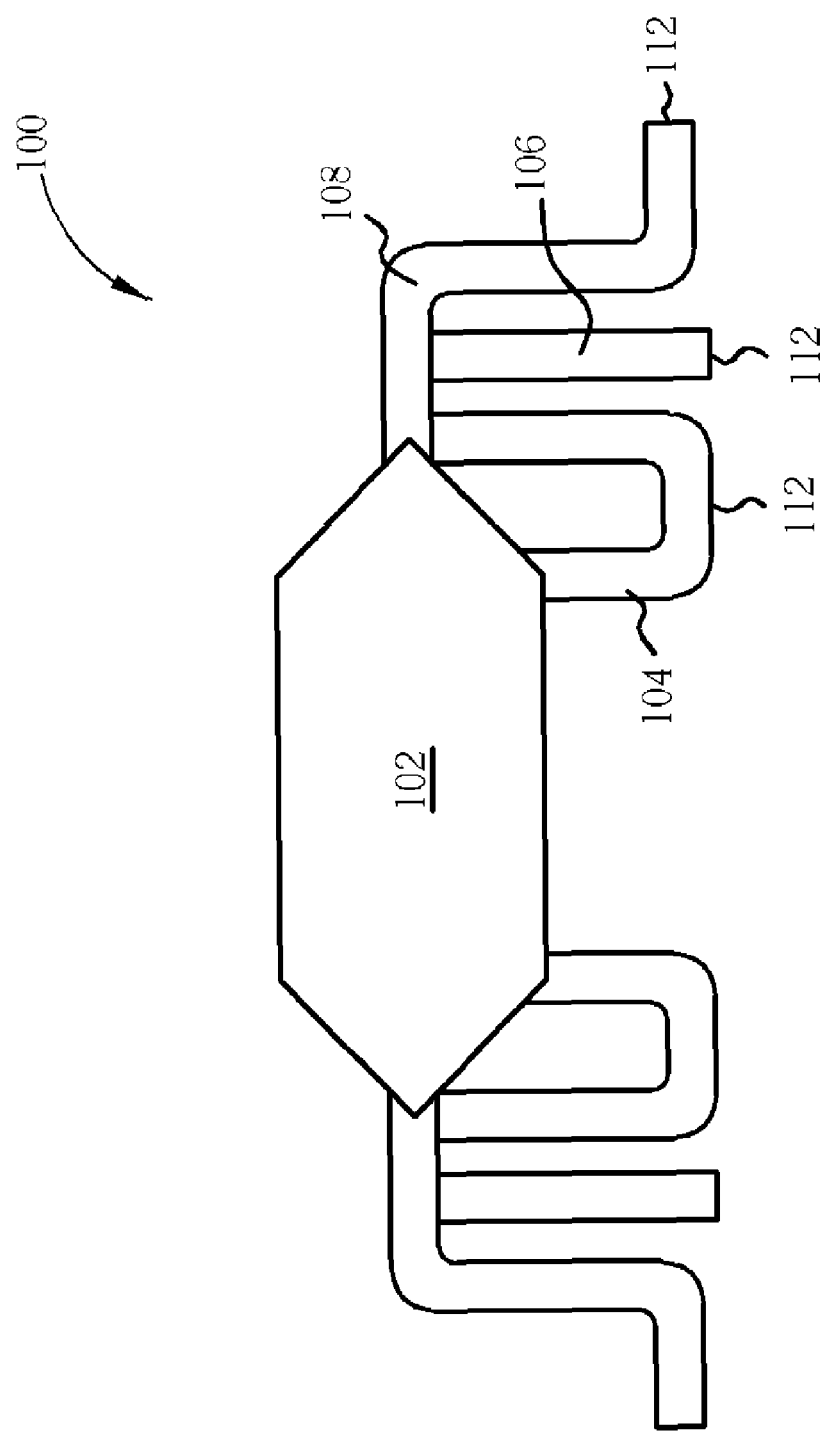
FIG. 14 is a schematic side view of the lead frame package structure in FIG. 13.
Figure 15:
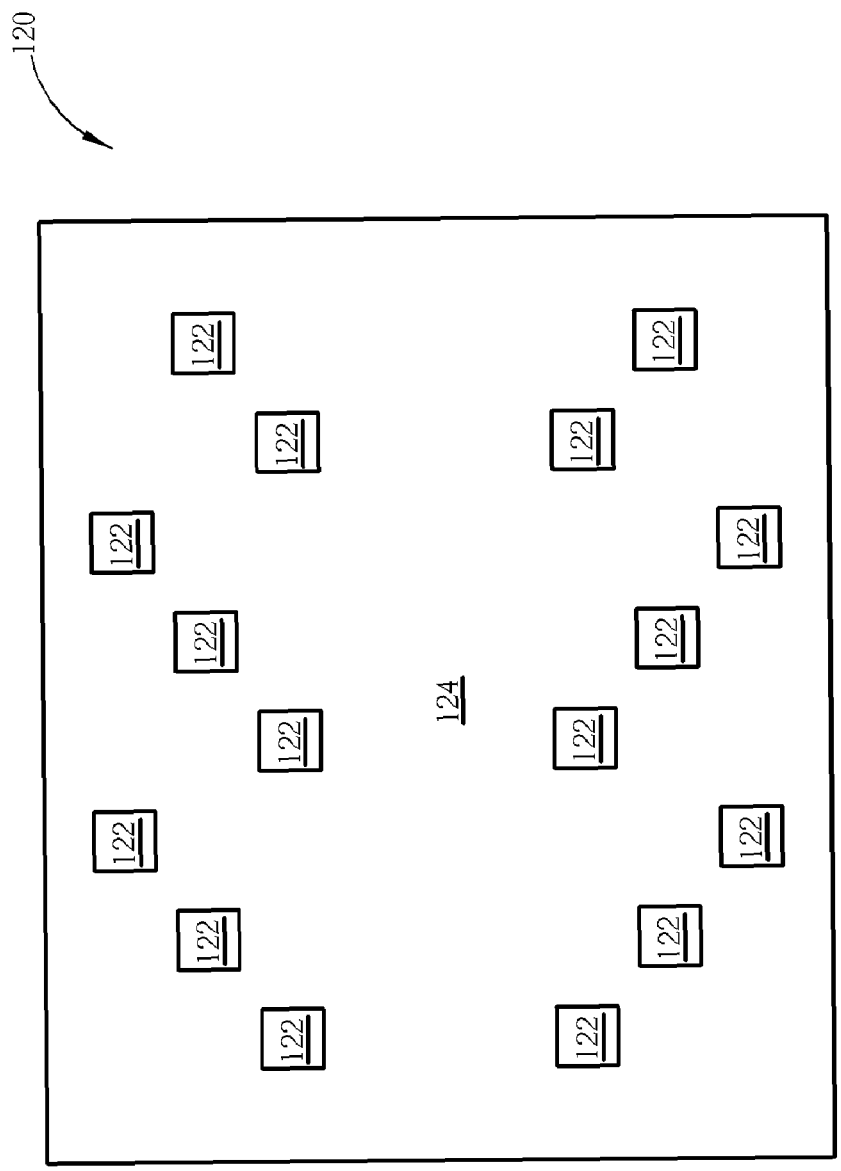
FIG. 15 is a schematic top view of a printed circuit board according to the fourth preferred embodiment of the present invention.

Please refer to FIG. 13, FIG. 14, and FIG. 15. FIG. 13 is a schematic top view of a lead frame package structure 100 according to the fourth preferred embodiment of the present invention, FIG. 14 is a schematic side view of the lead frame package structure 100 in FIG. 13, and FIG. 15 is a schematic top view of a printed circuit board 120 according to the fourth preferred embodiment of the present invention. As shown in FIG. 13 and FIG. 14, different from the above three preferred embodiments, the lead frame package structure 100 comprises a die package 102, a plurality of J-leads 104, a plurality of I-leads 106 and a plurality of L-leads 108. Each lead pin comprises an inner terminal (not shown in the figure) and an outer terminal 112. As shown in FIG. 15, the printed circuit board 120 is provided. The printed circuit board 120 comprises a plurality of bonding pads 122 corresponding to the outer terminals 112. Furthermore, a solder resist 124 is formed on the surface of the printed circuit board 120 except for the bonding pads 122. The outer terminals 112 of the J-leads 104, the outer terminals 112 of the I-leads 106 and the outer terminals 112 of the L-leads 108 are electrically connected to the corresponding bonding pads 122 of the printed circuit board 120. The characteristic of this preferred embodiment is that both the outer terminals 48 and the bonding pads 52 are staggered and arranged in three lines so that the distance between the outer terminals 112 in the same line, and the distance between the bonding pads 122 in the same line are even longer.

Figure 16:
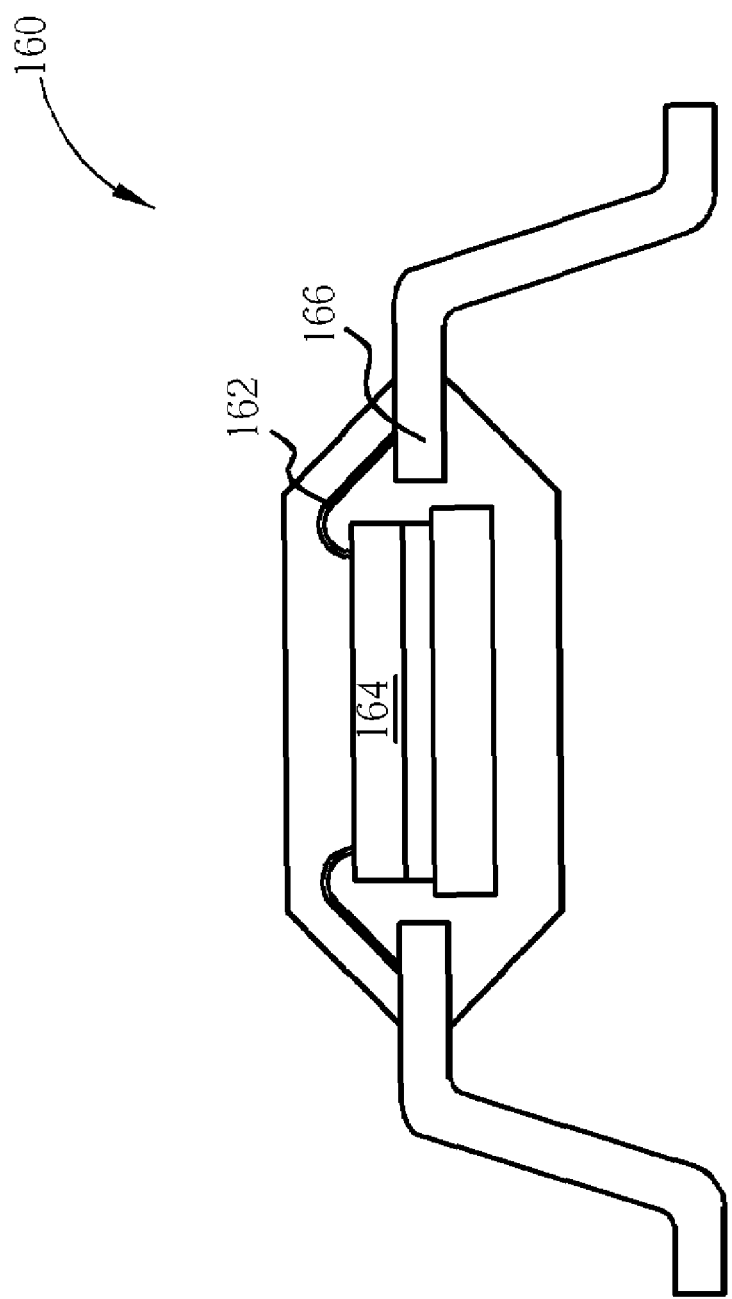
FIG. 16 is a schematic view of a wire bonding package structure.
Figure 17:
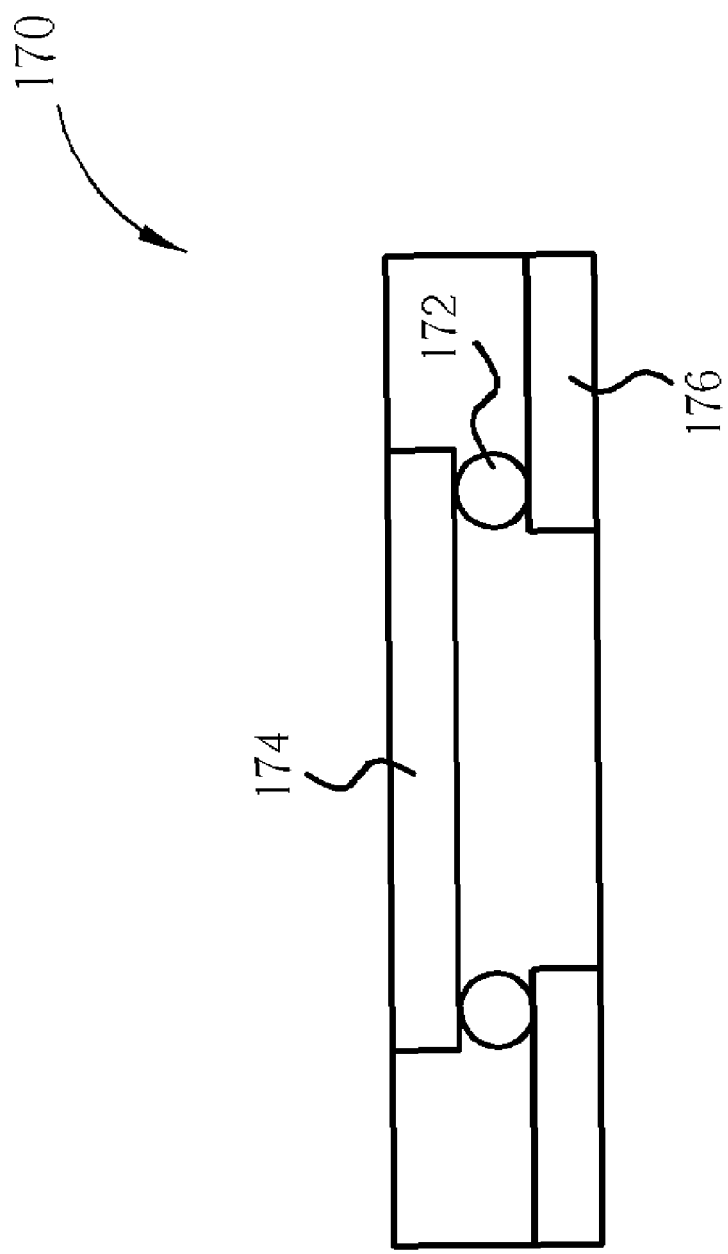
FIG. 17 is a schematic view of a flip chip package structure.

Wire bonding or flip chip bonding can be applied to bond a die and the lead pins in the present invention. Please refer to FIG. 16 and FIG. 17. FIG. 16 is a schematic view of a wire bonding package structure 160, and FIG. 17 is a schematic view of a flip chip package structure 170. As shown in FIG. 16, a die 164 is electrically connected to a plurality of inner terminals 166 by a plurality of wires 162. As shown in FIG. 17, a die 174 is electrically connected to a plurality of inner terminals 176 by a plurality of bumps 172.

In the lead frame package structure with straight lead pin arrangement, the density of the outer terminals and the density of the corresponding bonding pads should increase as the density of lead pins increases. However, the probability of cross-talk, the probability of interference, and the difficulty of manufacturing the package structure increases as well. Briefly, the density of the outer terminals and the density of the corresponding bonding pads are raised in the lead frame package structure of the present invention without increasing the density of lead pins. Furthermore, the density of the outer terminals and the density of the corresponding bonding pads are raised without increasing the difficulty of surface mount technology or the difficulty of operating printed circuit board.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lead frame package structure, comprising:
   a die;
   a plurality of first type lead pins positioned on at least one side of the die and electrically connected to the die, each of the first type lead pins comprising a first outer terminal;
   a plurality of second type lead pins positioned on at least one side of the die and electrically connected to the die, each of the second type lead pins comprising a second outer terminal, wherein the first type lead pins and the second type lead pins are two different types of lead pins selected from the group consisting of J-leads, L-leads and I-leads; and
   a die package, encapsulating the die, parts of the first type lead pins and parts of the second type lead pins, and exposing the first outer terminals and the second outer terminals;
   wherein a distance from the first outer terminals to a center of the die package and a distance from the second outer terminals to the center of the die package are different, so that the first outer terminals and the second outer terminals are staggered.

2. The lead frame package structure of claim 1, wherein each first type lead pin comprises a first inner terminal electrically connected to the die, and each second type lead pin comprises a second inner terminal electrically connected to the die.

3. The lead frame package structure of claim 2, wherein the die is electrically connected to the first inner terminals and the second inner terminals by wire bonding.

4. The lead frame package structure of claim 2, wherein the die is directly electrically connected to the first inner terminals and the second inner terminals by flip chip bonding.

5. The lead frame package structure of claim 4, wherein a distance from the first inner terminals to a center of the die and a distance from the second inner terminals to the center of the die are different, so that the first inner terminals and the second inner terminals are staggered.

6. The lead frame package structure of claim 1, wherein the first type lead pins and the second type lead pins are staggered.

7. The lead frame package structure of claim 1, wherein a distance from the first outer terminals to a center of the die and a distance from the second outer terminals to the center of the die are different, so that the first outer terminals and the second outer terminals are staggered.

* * * * *